United States Patent
Rzyski et al.

(10) Patent No.: US 8,363,849 B2
(45) Date of Patent: Jan. 29, 2013

(54) AUTOMATED INTERFEROMETRIC NOISE MEASUREMENT

(75) Inventors: Eugene Rzyski, Irvine, CA (US); Todd Wangsness, Murrieta, CA (US)

(73) Assignee: Omniphase Research Laboratories, Inc., Newport Beach, CA (US)

( * ) Notice: Subject to any disclaimer, the term of this patent is extended or adjusted under 35 U.S.C. 154(b) by 1391 days.

(21) Appl. No.: 11/469,472

(22) Filed: Aug. 31, 2006

(65) Prior Publication Data
US 2008/0075299 A1 Mar. 27, 2008

(51) Int. Cl.
*H04B 15/00* (2006.01)
(52) U.S. Cl. ............ 381/94.3; 381/94.1; 381/94.2; 381/94.7; 381/56; 455/296; 455/310
(58) Field of Classification Search .......... 381/94.1, 381/94.3, 56, 94.2, 94.7; 455/296, 310; 375/227, 375/296, 346
See application file for complete search history.

(56) References Cited

FOREIGN PATENT DOCUMENTS
WO WO97/46890 12/1997

OTHER PUBLICATIONS

Enrico Rubiola et al.: "The +−45 degree Correlation Interferometer as a Means to Measure Phase Noise of Parametric Origin" IEEE Transactions on Instrumentation and Measurement, IEEE Service Center, Piscataway, NJ, US, vol. 52, No. 1, Feb. 2003, XP011074091 ISSN: 0018-9456.*

Enrico Rubiola et al: "The ±45°Correlation Interferometer as a Means to Measure Phase Noise of Parametric Origin," IEEE Transactions on Instrumentation and Measurement, IEEE Service Center, Piscataway, NJ, US, vol. 52, No. 1, Feb. 2003, XP011074091, ISSN: 0018-9456/03.

* cited by examiner

*Primary Examiner* — Vivian Chin
*Assistant Examiner* — Paul Kim
(74) *Attorney, Agent, or Firm* — The Eclipse Group LLP

(57) ABSTRACT

In one embodiment, an automated interferometric noise measurement system includes: a signal source adapted to provide a carrier signal; a delay line adapted to delay a first version of the carrier signal to provide a delayed signal to a device-under-test (DUT); a variable attenuator adapted to attenuate a second version of the carrier signal to provide an attenuated signal; a first variable phase-shifter adapted to phase-shift the attenuated signal to provide a first phase-shifted signal; a hybrid coupler adapted to receive an output signal from the DUT and the first phase-shifted signal to provide a carrier-suppressed signal and a carrier-enhanced signal; a low-noise amplifier adapted to amplify the carrier-suppressed signal to provide an amplified signal; a second variable phase-shifter adapted to phase-shift a version of the carrier-enhanced signal to provide a second phase-shifted signal; a first mixer adapted to mix a first version of the amplified signal and the second phase-shifted signal to provide a first noise signal; and a controller adapted to control the variable attenuator, the first and second phase-shifters, and the low-noise amplifier responsive to a zero-crossing value in the first noise signal.

14 Claims, 5 Drawing Sheets

AUTOMATED INTERFEROMETRIC NOISE MEASUREMENT

FIELD OF INVENTION

This invention relates to electronic noise measurement and more particularly to an automated interferometric noise measurement system.

BACKGROUND

Noise in electrical systems and other types of systems such as electro-optic and electro-acoustic systems may disrupt both the amplitude and phase of signals. Although many systems are relatively insensitive to fluctuations in amplitude, both the fluctuations in phase (denoted as phase noise) and amplitude (denoted as amplitude noise) are important system parameters. Thus, a number of techniques have been developed to measure noise.

One technique to measure noise may be denoted as a phase-locked discriminator or frequency modulator (FM) discriminator. To measure the additive noise of a device under test (DUT) in a phase-locked discriminator, a low-noise source provides a signal to the DUT. For example, the DUT may comprise an amplifier that would then provide an amplified version of the low-noise source signal (which may also be denoted as the carrier signal). To remove the effects of the carrier signal so as to isolate the noise introduced by the DUT, the DUT output signal is mixed with a 90 degree phase-shifted (quadrature) version of the carrier signal. Mixing is performed in a non-linear component that is relatively noisy. The noise from the mixer (which may be characterized as a noise temperature) may be a limiting factor in phase-locked discriminator systems.

An interferometric noise measurement technique is an alternative technique that functions to reduce the noise contributed from the mixing stage. An exemplary interferometric noise measurement system is illustrated in FIG. 1. A low-noise source drives both a delay line 105 and an attenuator and phase-shifter 110. The delayed signal from the delay line drives a DUT 115, which in turn provides an output signal 120. Both output signal 120 and an attenuated and phase-shifted signal 125 from the attenuator/phase-shifter are received at a 3 dB hybrid coupler 130. The 3 dB hybrid coupler is arranged to provide a carrier-enhanced output signal B and a carrier-suppressed output signal A. Signal A is amplified in a low-noise amplifier 135 and received at a double sideband mixer 140. The mixer also receives a phase-shifted version of signal B from a phase-shifter 145. If phase-shifter 145 phase-shifts signal B to be in phase with the amplified signal A, then the output of the mixer represents the amplitude noise contributed by the DUT. Alternatively, if phase-shifter 145 phase-shifts signal B so as to be in quadrature with the amplified signal A, then the output of the mixer represents the phase noise contributed by the DUT. But regardless of which noise measurement is made, noise from the mixer may be reduced by the gain of the low-noise amplifier.

Although interferometric noise measurement thus provides a sensitive noise measurement, the tuning of the various components is extremely complex and time-consuming. Accordingly, there is a need in the art for improved interferometric noise measurement techniques.

SUMMARY

In accordance with a first aspect of the invention, an automated interferometric noise measurement system includes: a signal source adapted to provide a carrier signal; a delay line adapted to delay a first version of the carrier signal to provide a delayed signal to a device-under-test (DUT); a variable attenuator adapted to attenuate a second version of the carrier signal to provide an attenuated signal; a first variable phase-shifter adapted to phase-shift the attenuated signal to provide a first phase-shifted signal; a hybrid coupler adapted to receive an output signal from the DUT and the first phase-shifted signal to provide a carrier-suppressed signal and a carrier-enhanced signal; a low-noise amplifier adapted to amplify the carrier-suppressed signal to provide an amplified signal; a second variable phase-shifter adapted to phase-shift a version of the carrier-enhanced signal to provide a second phase-shifted signal; a first mixer adapted to mix a first version of the amplified signal and the second phase-shifted signal to provide a first noise signal; and a controller adapted to control the variable attenuator, the first and second phase-shifters, and the low-noise amplifier responsive to a zero-crossing value in the first noise signal.

In accordance with another aspect of the invention, sn automated interferometric noise measurement system includes: a signal source adapted to provide a carrier signal; a delay line adapted to delay a first version of the carrier signal to provide a delayed signal; a variable attenuator adapted to attenuate a second version of the carrier signal to provide an attenuated signal; a first variable phase-shifter adapted to phase-shift the attenuated signal to provide a first phase-shifted signal; a hybrid coupler adapted to receive the delayed signal and the first phase-shifted signal to provide a carrier-suppressed signal and a carrier-enhanced signal; a low-noise amplifier adapted to amplify the carrier-suppressed signal to provide an amplified signal; a second variable phase-shifter adapted to phase-shift a version of the carrier-enhanced signal to provide a second phase-shifted signal; a first mixer adapted to mix a first version of the amplified signal and the second phase-shifted signal to provide a first noise signal; and a controller adapted to control the variable attenuator, the first and second phase-shifters, and the low-noise amplifier responsive to a zero-crossing value in the first noise signal, whereby the first noise signal provides a measure of a noise floor for the signal source.

In accordance with another aspect of the invention, an automated interferometric noise measurement system includes: a signal source adapted to provide a carrier signal; a delay line adapted to delay a first version of the carrier signal to provide a delayed signal; a variable attenuator adapted to attenuate delayed signal to provide an attenuated signal to an amplifier device-under-test (DUT); a first variable phase-shifter adapted to phase-shift a second version of the carrier signal to provide a first phase-shifted signal; a hybrid coupler adapted to receive an output signal from the amplifier DUT and the first phase-shifted signal to provide a carrier-suppressed signal and a carrier-enhanced signal; a low-noise amplifier adapted to amplify the carrier-suppressed signal to provide an amplified signal; a second variable phase-shifter adapted to phase-shift a version of the carrier-enhanced signal to provide a second phase-shifted signal; a first mixer adapted to mix a first version of the amplified signal and the second phase-shifted signal to provide a first noise signal; and a controller adapted to control the variable attenuator, the first and second phase-shifters, and the low-noise amplifier responsive to a zero-crossing value in the first noise signal.

The invention will be more fully understood upon consideration of the following detailed description, taken together with the accompanying drawings.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
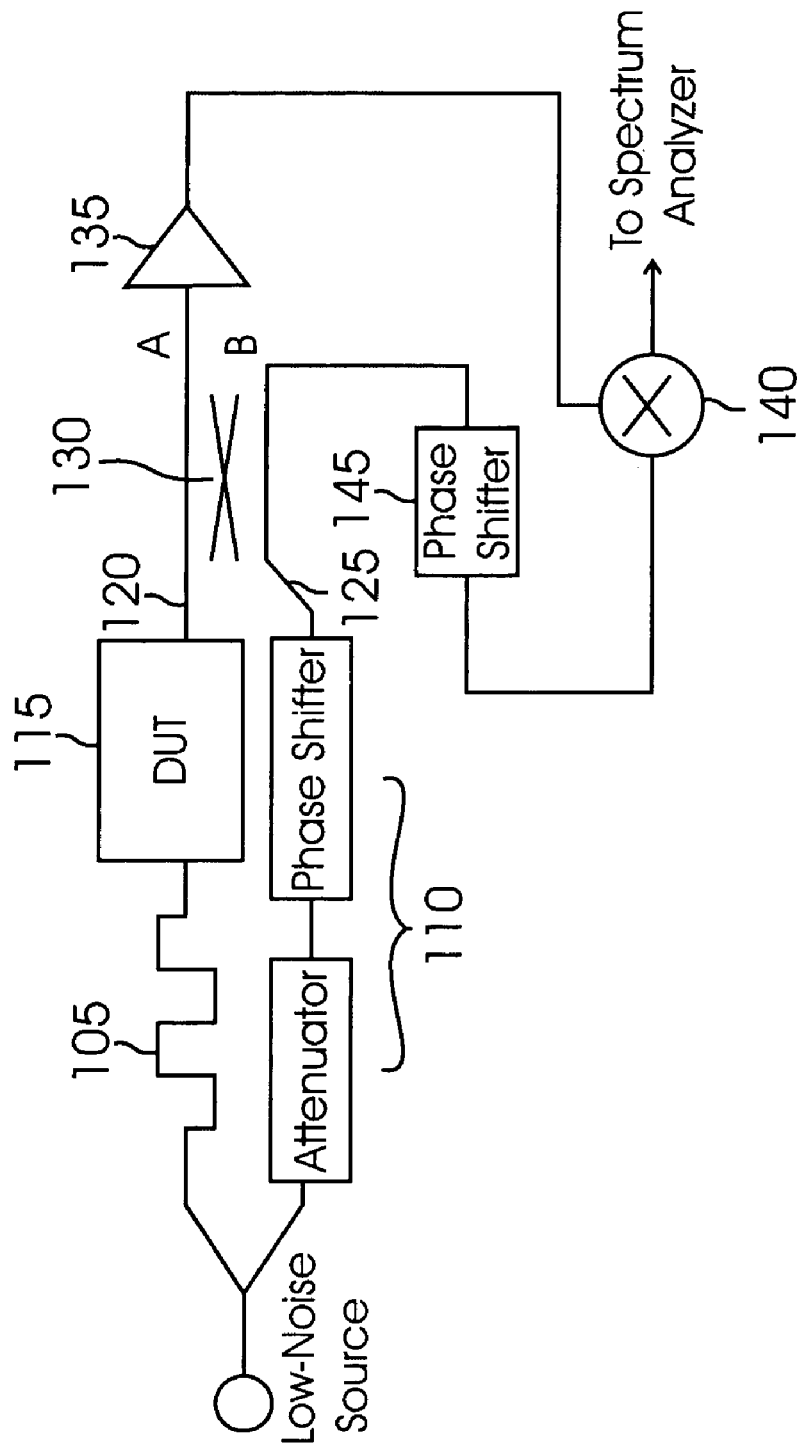
FIG. 1 is a block diagram of a conventional interferometric noise measurement system.

To provide an improved interferometric noise measurement system, a microwave interferometer is provided that eliminates the need for cumbersome manual tuning. Turning now to the FIG. 2, an exemplary automated microwave interferometer 200 is illustrated. As discussed analogously with regard to FIG. 1, a low-noise source drives a delay line 105 and also a variable attenuator and phase-shifter 201 with a carrier signal. A delayed version of the carrier signal from the delay line drives a device-under-test (DUT) that provides an output signal 120. An attenuated and phase-shifted signal 125 from variable attenuator/phase-shifter 201 is processed with output signal 120 in a 3 dB hybrid coupler 130. The hybrid coupler outputs a carrier-enhanced signal B and a carrier-suppressed signal A. Signal A is amplified by a low-noise amplifier 235. The control of the variable attenuator and phase-shifter will be discussed below. Depending upon the phase-shift provided to carrier-enhanced signal B by a variable phase-shifter 245, either a phase noise measurement or an amplitude noise measurement may be performed. In interferometer 200, carrier-enhanced signal B is phase-shifted by variable phase-shifter 245 so as to be in quadrature (90 degrees out of phase) with the output from low-noise amplifier 235 such that an output signal from a mixer C may be used to form an additive phase-noise measurement for the DUC, which may also be denoted as a unit-under-test (UUT).

A controller 241 such as a microprocessor or a digital signal processor automates the operation of the interferometer by controlling variable attenuator and phase-shifter 201 as well the phase-shift provided by variable phase-shifter 245. It will be appreciated controller 241 may also be implemented using an ASIC-implemented state machine configured with the control algorithms discussed below. In another embodiment, a configured programmable logic device such as an FPGA may be used to provide the desired control. Regardless of the hardware used to perform the control functions, the control of the phase-shifters and other controllable variables may be performed using a number of control algorithms. The control signal to each variable component such as variable attenuator and phase-shifter 201 may be denoted as a "control variable" (CV). The tuning of a CV depends upon it effect upon a measured variable (MV). It may be immediately noted that variable attenuator and phase-shifter 201 should be controlled to minimize the carrier signal in carrier-suppressed signal A. Thus, an appropriate MV for such control would be the carrier power in carrier-enhanced signal A. One way to measure the carrier power in signal A is to extract a version of signal A prior to its amplification through variable amplifier 235. For example, a coupler 250 may extract a version of signal A (designated as A1). Signal A1 may then drive a diode detector 255. An amplifier 260 ensures that the envelope signal from the diode detector falls within the dynamic range of an analog-to-digital converter (ADC) 265 that provides the digitized carrier power to the controller. Based upon this MV (the digitized carrier power), the controller then drives variable attenuator and phase-shifter 201 to minimize this MV as will be explained further.

Another amplifier 275 may also amplify the output of mixer C to keep the amplified signal within the dynamic range of an ADC 280 (although ADC 265 and 285 are illustrated as separate components, it will be appreciated that their functions could be implemented using a single ADC). With regard to the control of interferometer 200, an additional exemplary MV is an amplitude-noise signal 220 coming from ADC 280. This digitized signal may be analyzed using spectral techniques in the controller. For example, the digitized signal may be analyzed using a Fast Fourier Transform (FFT) to reveal the phase-noise spectrum. Alternatively, wavelet or fractal techniques may be used to determine the noise spectrum.

To obtain the phase-noise spectrum, phase-shifter 245 is controlled by a CV 251 from the controller so as to be in quadrature with the amplified signal from variable low-noise amplifier 235. If, however, the carrier is not eliminated due to an error in CV 251, the carrier will be present as a DC offset in the resulting phase-noise spectrum. This DC offset will change sign as phase-shifter 245 scans through quadrature (for example, from 80 to 100 degrees) such that it has one polarity on one side of the quadrature and an opposite polarity on the other side of quadrature. This change of sign may be used in a zero-crossing search. In general, a CV that produces a zero-crossing MV may have its range divided into a number of intervals. The controller steps the CV through these intervals and observes the effect on the zero-crossing MV. For example, the zero-crossing MV may change sign with regard to two values $MV_0$ and $MV_1$ corresponding to values for the CV of $CV_0$ and $CV_1$, respectively. Given this straddling of the zero-crossing point, it may be shown that an optimal setting for the CV ($CV_{opt}$) is:

$$CV_{opt} = (CV_0 * MV_1 - CV_1 * MV_0)/(MV_1 - MV_0) \qquad \text{Eq. (1)}$$

In general, a $CV_{opt}$ such as CV 251 will change with time due to temperature changes and other effects. This change with respect to time may be tracked using a convergence algorithm. For example, the straddling interval (corresponding to $CV_1$ and $CV_0$) may be reduced by a convergence factor such as two. A new value for $CV_{opt}$ is then calculated using, for example, Equation (1). The difference between successive measurements may then be averaged with previously-obtained differences to provide a time-varying-corrective factor. A calculated $CV_{opt}$ may then be adjusted according to the time-varying-corrective factor. Prior to updating the CV, a measurement of the MV with regard to a tolerance factor may be performed.

An exemplary control algorithm for control variables (CVs) 290 and 291 from the controller to drive variable attenuator and phase-shifter 201 will now be discussed. CVs 290 and 291 are driven to minimize the carrier power in the digitized signal from ADC 265. To find this minimum, CVs 290 and 291 may be incremented across their range such that for five successive increments of a CV ranging from a value of $CV_0$ to $CV_4$, the corresponding values of the MV (power in the digitized signal from ADC 265) are produced such that $MV_2 < MV_1 < MV_0$ and also $MV_2 < MV_3 < MV_4$. The value of the CV that produces the minimum MV would thus be $CV_2$. If no minimum is found across the available range for the CV, the intervals between successive CV values may be too broad such that a new search is performed with the interval spacing reduced by ½. Once the minimum is found, the interval between CV0 and CV4 is sampled at twice the previous rate such that the interval between successive CV points is ½ what was used in the previous search. If the minimum pattern is no longer discernable, it may be presumed that the algorithm has zoomed into the noise at the minimum of the MV variable. The minimum in the MV for the last iteration of CVs in which the pattern is discernable provides the corresponding $CV_{opt}$ value. This $CV_{opt}$ value may be tracked as discussed with regard to the zero-crossing MV control. Note the advantage of using diode detector 255—the coherent control of the phase-shifter in variable attenuator and phase-shifter 201 is achieved using an incoherent (and inexpensive) diode detector. As an alternative to the diode detector, coherent detection means such as the direct downconversion technique disclosed in U.S. Pat. No. 6,745,020 may also be used to detect the carrier power in signal A1.

Figure 2:
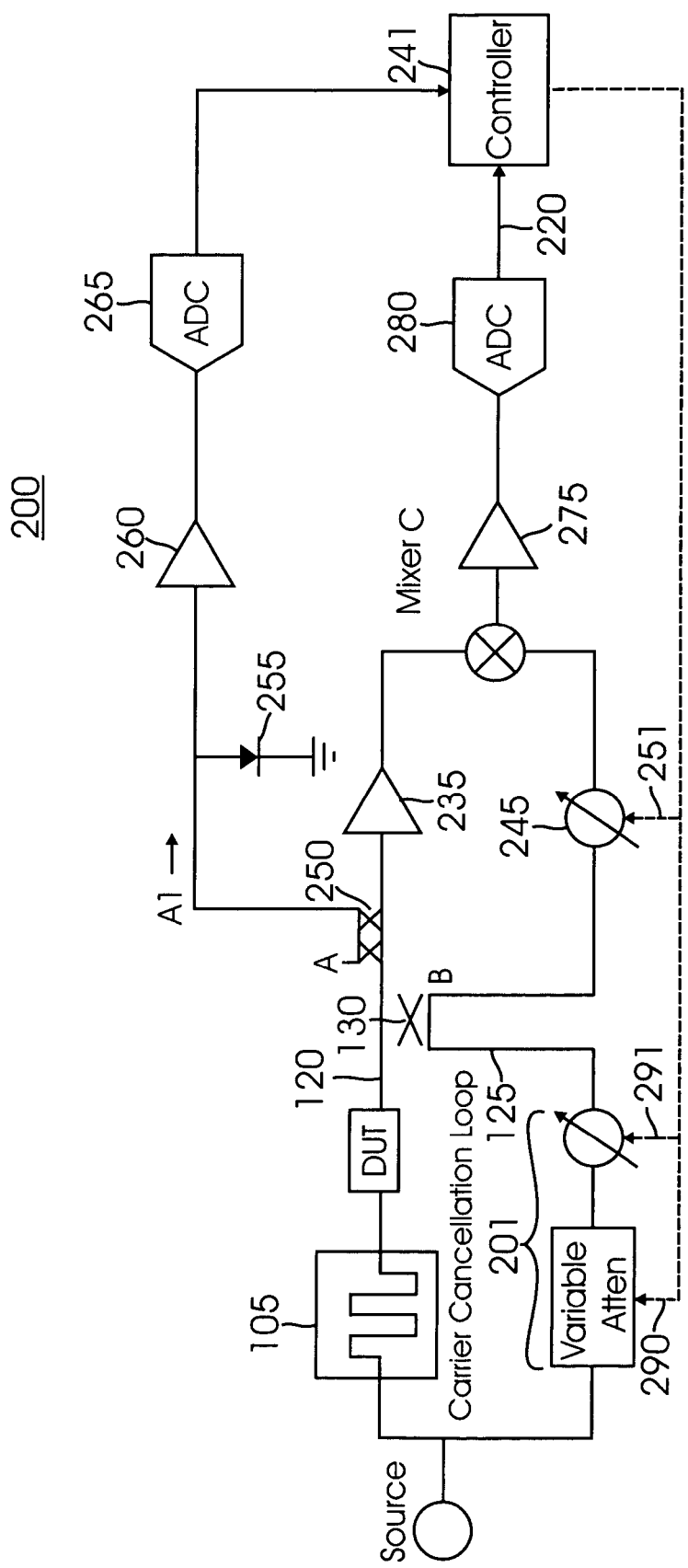
FIG. 2 is a block diagram of an automated interferometric noise measurement system for a non-source/non-amplifying device-under-test (DUT) in accordance with an embodiment of the invention.
Figure 3:
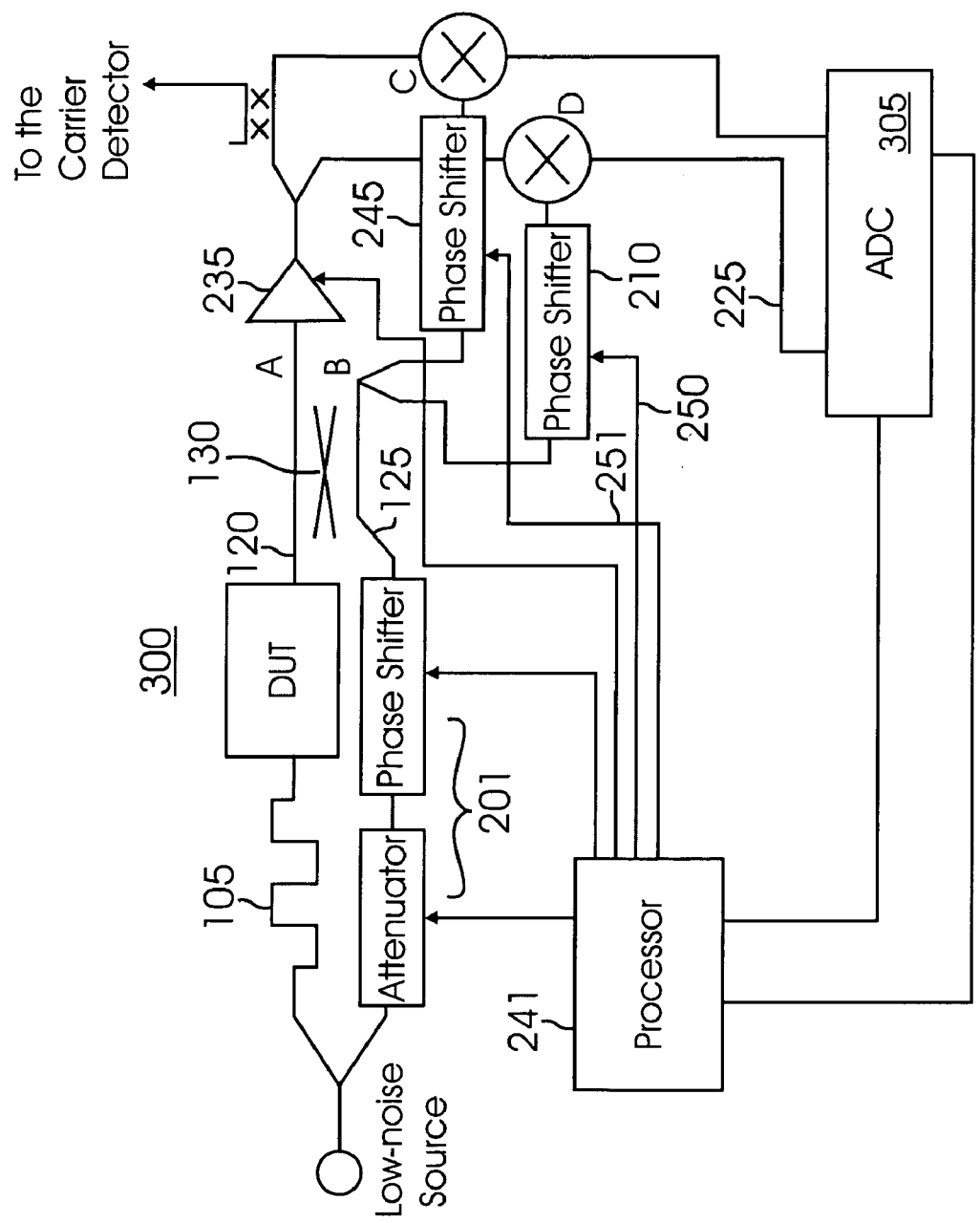
FIG. 3 is a block diagram of an automated interferometric noise measurement system for a non-source/non-amplifying DUT, wherein the system may perform both amplitude and phase noise measurement in accordance with an embodiment of the invention.

Turning now to FIG. 3, an interferometer 300 includes mixer C as discussed with regard to FIG. 2. To allow the measurement of additive amplitude noise as well, interferometer 300 includes a mixer D. Both mixer C and D are driven by the amplified signal from low-noise amplifier 235. Similarly, both variable phase-shifter 245 and a variable phase-shifter 210 are driven with the carrier-enhanced signal B from the hybrid coupler. Phase-shifter 245 is controlled to maintain quadrature as discussed with regard to FIG. 2. In contrast, phase-shifter 210 is controlled so that its output signal is in-phase with the amplified version of carrier-suppressed signal A from low-noise amplifier 235. Thus, an output signal 225 from mixer D may be digitized in an ADC 305 and the resulting digitized signal analyzed by processor 241 to determine the additive amplitude noise contribution from the DUT. This spectral analysis may occur using a Fast Fourier Transform (FFT) to reveal the amplitude-noise spectrum. Alternatively, wavelet or fractal techniques may be used to determine the noise spectrum. For illustration clarity, the carrier detection signal loop (such as implemented using the diode detector of FIG. 2) is not illustrated. Moreover, comparison of FIGS. 2 and 3 show that the carrier detection may be performed before or after low-noise amplifier 235. Because a DC offset in the output signal from mixer D is maximized when phase-shifter 210 maintains an in-phase state between its output signal and the output from low-noise amplifier 235, a measured variable (MV) for the control of phase-shifter 210 is the DC signal present in the digitized version of the mixer D output signal. The corresponding control variable (CV) is a control signal 250 from the processor that drives phase-shifter 210. This CV may be controlled to find a maximum value in the corresponding MV. For example, CV 250 may be incremented across its range such that for five successive increments of the CV ranging from a value of $CV_0$ to $CV_4$, the corresponding values of the MV is produced such that $MV_2 > MV_1 > MV_0$ and also $MV_2 > MV_3 > MV_4$. The value of the CV that produces the maximum MV would thus be $CV_2$. If no maximum is found across the available range for the CV, the intervals between successive CV values may be too broad such that a new search is performed with the interval spacing reduced by ½. Once the maximum is found, the interval between CV0 and CV4 is sampled at twice the previous rate such that the interval between successive CV points is ½ what was used in the previous search. If the maximum pattern is no longer discernable, it may be presumed that the algorithm has zoomed into the noise at the maximum of the MV variable. The maximum in the MV for the last iteration of the CV in which the pattern is discernable provides the corresponding $CV_{opt}$ value. This $CV_{opt}$ value may be tracked as discussed with regard to the zero-crossing MV control. In some embodiments, low-noise amplifier 235 may also be a variable gain amplifier that is controlled by the controller to maintain linear operation of mixers C and D.

It may be observed that the gain provided by variable low-noise amplifier 235 as well as the attenuation and phase-shift from variable attenuator and phase-shifter 201 will also affect the zero-crossing DC point in signal 225. Empirical observations may show that a single CV has a dominant effect. For example, CV 251 may be the dominant CV for the zero-crossing point in mixer C's output signal (as opposed to CVs 290 and 291). Thus, in such embodiments, the dominant CV may be tuned first, followed by the less dominant CVs. However, it will be appreciated that this tuning methodology may be readily extended to the control of multiple CVs in parallel.

Figure 4:
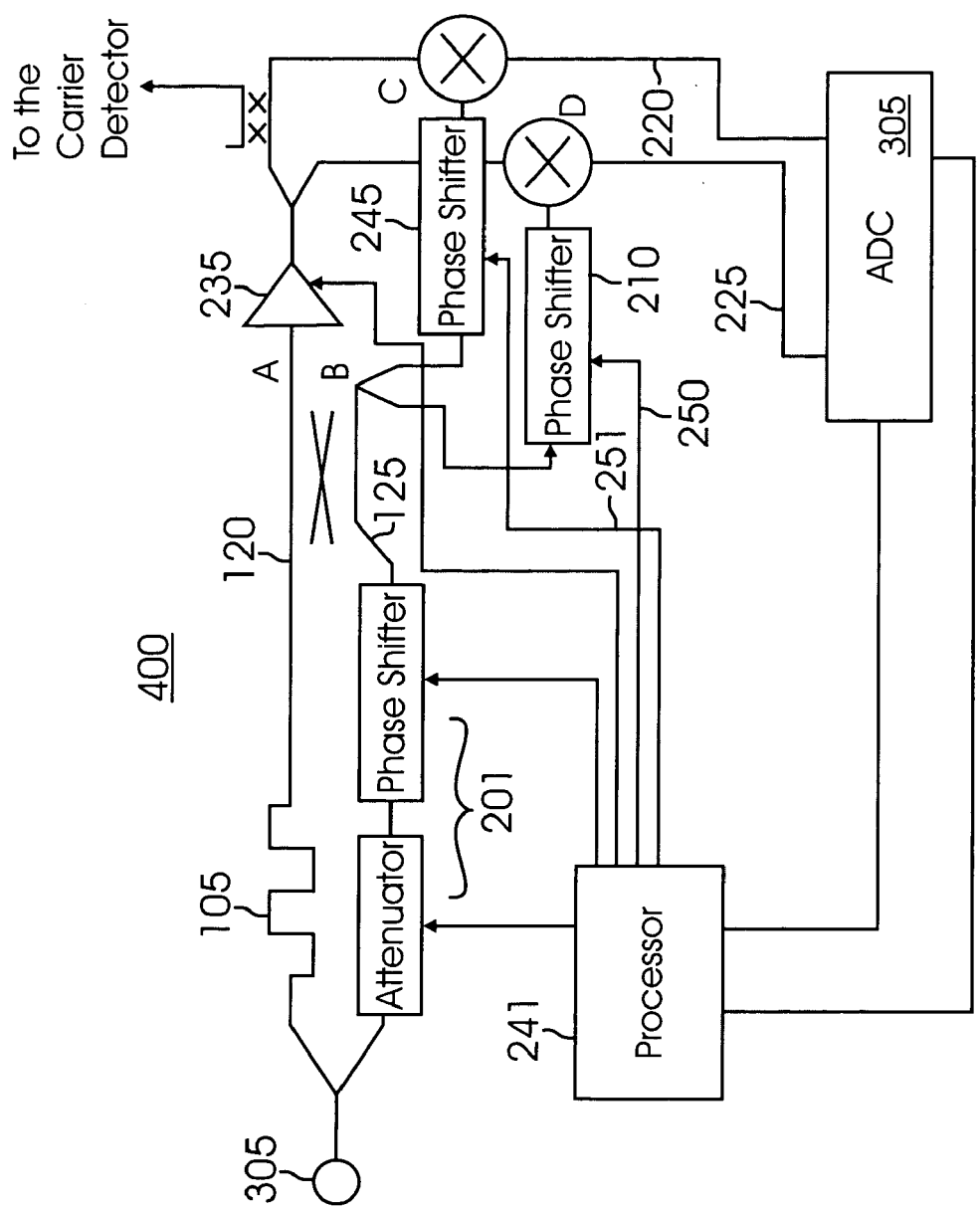
FIG. 4 is a block diagram of an automated interferometric noise measurement system for a source DUT in accordance with an embodiment of the invention.

Turning now to FIG. 4, an automated microwave interferometer 400 is illustrated that may be used to measure the noise floor of a low noise source 305. In such an embodiment, the source itself is the DUT. Thus, the delay line is not followed by a separate DUT as discussed with regard to FIG. 2. Using the setup shown in FIG. 4, a user may first determine the noise floor of a source. Having determined its noise floor, the user may then use the characterized source in the configuration of FIG. 2 or 3 to drive a DUT. In this fashion, the absolute additive noise of the DUT may be characterized. Given the noise floor for the source, it may be subtracted from the noise measurements discussed with regard to FIGS. 2 and 3 so that the additive noise may be calculated.

Figure 5:
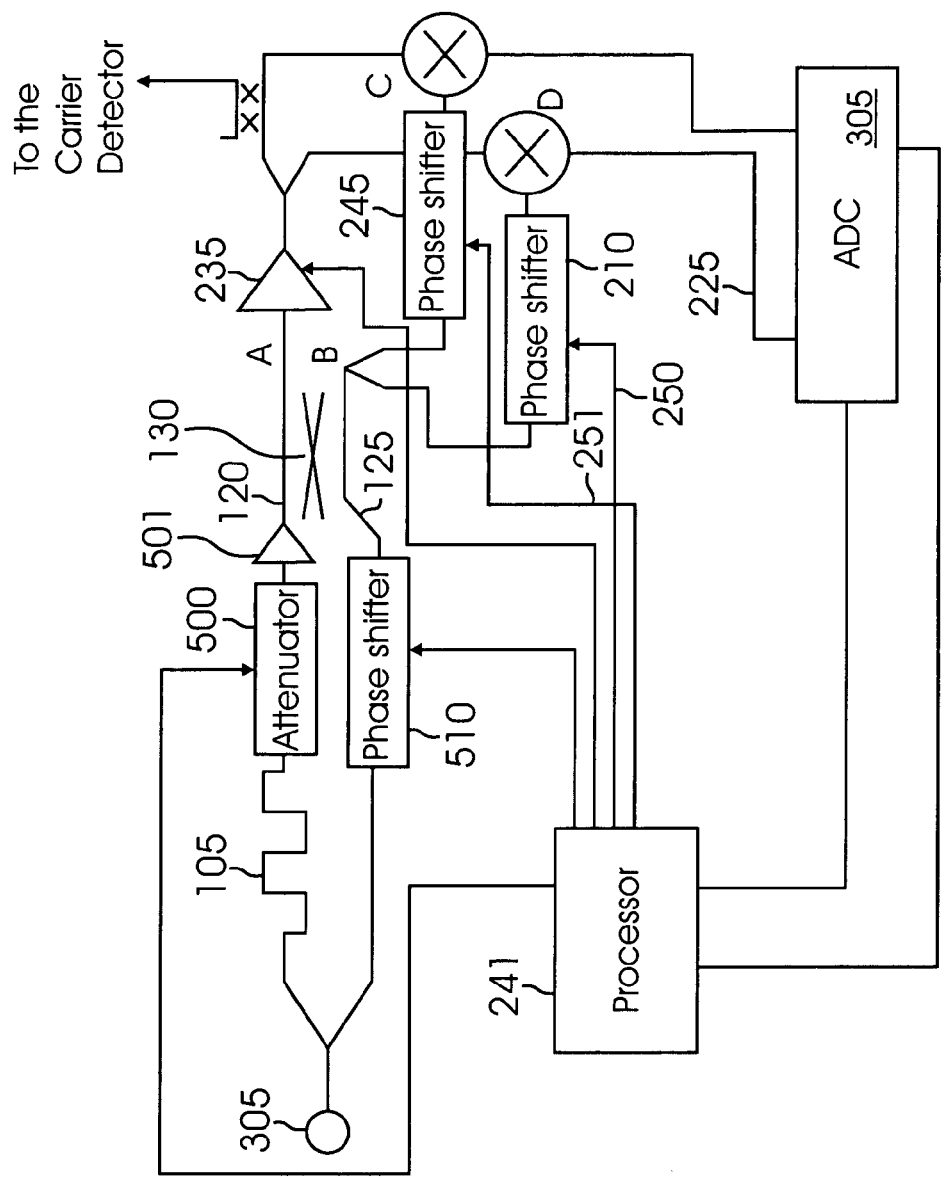
FIG. 5 is a block diagram of an automated interferometric noise measurement system for an amplifying DUT in accordance with an embodiment of the invention.

Referring back to FIG. 2, it may be seen that the attenuator in variable attenuator and phase-shifter 201 mimics the power loss introduced into output signal 120 by the delay line/DUT combination. In this fashion the powers of signals 120 and 125 may be substantially equal. However, providing such a loss assumes that the DUT itself is lossy as would be the case, for example, should the DUT comprise a phase-shifter or an attenuator. If, however, the DUT comprises an amplifier, there is no need for an attenuator in the signal path that provides output signal 125. Instead, a variable attenuator 500 may drive an amplifier-under-test/DUT 501 as shown in FIG. 5. Signal 125 from a phase-shifter 510 would then represent a phase-shifted version of the carrier signal (rather than an attenuated and phase-shifted version as discussed with regard to FIG. 2), albeit attenuated by the transmission losses in the path leading from the source to output signal 125. The controller such as processor 241 drives attenuator 400 such that after amplification through amplifier 401, output signals 120 and 125 have substantially the same carrier signal power. The operation of mixers C and D are as discussed previously.

Although the invention has been described with respect to particular embodiments, this description is only an example of the invention's application and should not be taken as a limitation. For example, if one is not interested in characterizing the noise performance of the source but rather just a non-source DUT such as an amplifier or an attenuator, the delay line is an optional component (although some measure of noise performance for the source is necessary if one wishes to determine the additive noise introduced by the DUT). Similarly, additional feedback mechanisms may be used to set the tunable components at an approximated desired setting. Consequently, the scope of the invention is set forth in the following claims.

We claim:

1. An automated interferometric noise measurement system, comprising:
   a signal source adapted to provide a carrier signal;
   a delay line connected to receive the carrier signal, the delay line configured to delay the carrier signal to provide a delayed signal to a device-under-test (DUT) along a first signal path;
   a variable attenuator connected to receive the carrier signal, the variable attenuator configured to attenuate the carrier signal to provide an attenuated signal along a second signal path in parallel with the first signal path;
   a first variable phase-shifter configured to phase-shift the attenuated signal to provide a first phase-shifted signal along the second signal path;
   a hybrid coupler connected to the first signal path at a first hybrid coupler input to receive an output signal from the DUT, and to the second signal path at a second hybrid coupler input to receive the first phase-shifted signal, the hybrid coupler configured to provide a carrier-suppressed signal at a first output of the hybrid coupler and a carrier-enhanced signal at a second output of the hybrid coupler;
   a low-noise amplifier connected along a third signal path to the first output of the hybrid coupler, the low-noise amplifier configured to amplify the carrier-suppressed signal to provide an amplified signal;
   a second variable phase-shifter connected along a fourth signal path to the second output of the hybrid coupler, the second variable phase-shifter configured to phase-shift the carrier-enhanced signal to provide a second phase-shifted signal;
   a first mixer connected along the third signal path to the low-noise amplifier at a first mixer input and along the fourth signal path to the second variable phase-shifter at a second mixer input, the first mixer configured to mix the amplified signal from the low-noise amplifier and the second phase-shifted signal from the second variable phase-shifter to provide a first noise signal; and
   a controller configured to control the variable attenuator, the first and second phase-shifters, and the low-noise amplifier responsive to a zero-crossing value in the first noise signal.

2. The automated interferometric noise measurement system of claim 1, wherein the DUT is a phase-shifter.

3. The automated interferometric noise measurement system of claim 1, wherein the DUT is an attenuator.

4. The automated interferometric noise measurement system of claim 1, wherein the controller is configured to control the second variable phase-shifter such that the second phase-shifted signal is substantially in quadrature with the amplified signal.

5. The automated interferometric noise measurement system of claim 1, further comprising:
   a third variable phase-shifter connected along a fifth signal path to the second output of the hybrid coupler, the third variable phase-shifter configured to phase-shift the carrier-enhanced signal to provide a third phase-shifted signal; and
   a second mixer configured to mix the third phase-shifted signal with the amplified signal to provide a second noise signal, wherein the controller is further configured to control the variable attenuator, the first and third phase-shifters, and the low-noise amplifier responsive to a maximum carrier signal value in the second noise signal.

6. An automated interferometric noise measurement system, comprising:
   a signal source adapted to provide a carrier signal;
   a delay line connected to receive the carrier signal, the delay line configured to delay the carrier signal to provide a delayed signal;
   a variable attenuator connected to receive the carrier signal, the variable attenuator configured to attenuate the carrier signal to provide an attenuated signal along a second signal path in parallel with the first signal path;
   a first variable phase-shifter configured to phase-shift the attenuated signal to provide a first phase-shifted signal along the second signal path;
   a hybrid coupler connected to the first signal path at a first hybrid coupler input to receive the delayed signal, and to the second signal path at a second hybrid coupler input to receive the first phase-shifted signal, the hybrid coupler configured to provide a carrier-suppressed signal at a first output of the hybrid coupler and a carrier-enhanced signal at a second output of the hybrid coupler;
   a low-noise amplifier connected along a third signal path to the first output of the hybrid coupler, the low-noise amplifier configured to amplify the carrier-suppressed signal to provide an amplified signal;
   a second variable phase-shifter connected along a fourth signal path to the second output of the hybrid coupler, the second variable phase-shifter configured to phase-shift the carrier-enhanced signal to provide a second phase-shifted signal;
   a first mixer connected along the third signal path to the low-noise amplifier at a first mixer input and along the fourth signal path to the second variable phase-shifter at a second mixer input, the first mixer configured to mix the amplified signal from the low-noise amplifier and the second phase-shifted signal from the second variable phase-shifter to provide a first noise signal; and
   a controller configured to control the variable attenuator, the first and second phase-shifters, and the low-noise amplifier responsive to a zero-crossing value in the first noise signal, whereby the first noise signal provides a measure of a noise floor for the signal source.

7. The automated interferometric noise measurement system of claim 6, wherein the controller is adapted to control the second variable phase-shifter such that the second phase-shifted signal is substantially in quadrature with the amplified signal, whereby the first noise floor provides a measure of a phase-noise floor for the signal source.

8. The automated interferometric noise measurement system of claim 6, further comprising:
   a third variable phase-shifter connected along a fifth signal path to the second output of the hybrid coupler, the third variable phase-shifter configured to phase-shift the carrier-enhanced signal to provide a third phase-shifted signal; and
   a second mixer configured to mix the third phase-shifted signal with the amplified signal to provide a second noise signal, wherein the controller is further configured to control the variable attenuator, the first and third phase-shifters, and the low-noise amplifier responsive to a maximum carrier signal value in the second noise signal.

9. The automated interferometric noise measurement system of claim 8, wherein the controller is further adapted to control the third phase-shifter such that the third phase-shifted signal is substantially in phase with the second version of the amplified signal, whereby the second noise signal provides a measure of an amplitude noise floor for the signal source.

10. The automated interferometric noise measurement system of claim 9, wherein controller comprises at least one processor.

11. The automated interferometric noise measurement system of claim 10, wherein the controller comprises a programmable logic device.

12. An automated interferometric noise measurement system, comprising:
a signal source adapted to provide a carrier signal;
a delay line connected to receive the carrier signal, the delay line configured to delay the carrier signal to provide a delayed signal;
a variable attenuator connected to receive the carrier signal, the variable attenuator configured to attenuate the carrier signal to provide an attenuated signal along a second signal path in parallel with the first signal path to an amplifier device-under-test (DUT);
a first variable phase-shifter configured to phase-shift the attenuated signal to provide a first phase-shifted signal along the second signal path;
a hybrid coupler connected to the first signal path at a first hybrid coupler input to receive an output signal from the amplifier DUT, and to the second signal path at a second hybrid coupler input to receive the first phase-shifted signal, the hybrid coupler configured to provide a carrier-suppressed signal at a first output of the hybrid coupler and a carrier-enhanced signal at a second output of the hybrid coupler;
a low-noise amplifier connected along a third signal path to the first output of the hybrid coupler, the low-noise amplifier configured to amplify the carrier-suppressed signal to provide an amplified signal;
a second variable phase-shifter connected along a fourth signal path to the second output of the hybrid coupler, the second variable phase-shifter configured to phase-shift the carrier-enhanced signal to provide a second phase-shifted signal;
a first mixer connected along the third signal path to the low-noise amplifier at a first mixer input and along the fourth signal path to the second variable phase-shifter at a second mixer input, the first mixer configured to mix the amplified signal from the low-noise amplifier and the second phase-shifted signal from the second variable phase-shifter to provide a first noise signal; and
a controller configured to control the variable attenuator, the first and second phase-shifters, and the low-noise amplifier responsive to a zero-crossing value in the first noise signal.

13. The automated interferometric noise measurement system of claim 12, wherein the controller is adapted to control the second variable phase-shifter such that the second phase-shifted signal is substantially in quadrature with the amplified signal, whereby the first noise floor provides a measure of a phase-noise floor for the amplifier DUT.

14. The automated interferometric noise measurement system of claim 12, further comprising:
a third variable phase-shifter connected along a fifth signal path to the second output of the hybrid coupler, the third variable phase-shifter configured to phase-shift the carrier-enhanced signal to provide a third phase-shifted signal; and
a second mixer configured to mix the third phase-shifted signal with the amplified signal to provide a second noise signal, wherein the controller is further configured to control the variable attenuator, the first and third phase-shifters, and the low-noise amplifier responsive to a maximum carrier signal value in the second noise signal.

* * * * *